United States Patent

Sinha et al.

(10) Patent No.: US 7,136,519 B2
(45) Date of Patent: Nov. 14, 2006

(54) SPECIMEN TOPOGRAPHY RECONSTRUCTION

(75) Inventors: Jaydeep Sinha, Norwood, MA (US); Alexander Belyaev, Wayland, MA (US)

(73) Assignee: ADE Corporation, Westwood, MA (US)

( * ) Notice: Subject to any disclaimer, the term of this patent is extended or adjusted under 35 U.S.C. 154(b) by 751 days.

(21) Appl. No.: 09/914,456

(22) PCT Filed: Dec. 22, 2000

(86) PCT No.: PCT/US00/34806

§ 371 (c)(1),
(2), (4) Date: Aug. 28, 2001

(87) PCT Pub. No.: WO01/50084

PCT Pub. Date: Jul. 12, 2001

(65) Prior Publication Data

US 2002/0177980 A1    Nov. 28, 2002

Related U.S. Application Data

(60) Provisional application No. 60/174,082, filed on Dec. 30, 1999.

(51) Int. Cl.
*G06K 9/00* (2006.01)

(52) U.S. Cl. ............... 382/149; 382/190; 382/275; 702/81; 702/94; 702/191

(58) Field of Classification Search ............... 382/141, 382/144–152, 190–192, 201–207, 275, 280, 382/281; 356/394; 702/94–95, 190–194, 702/81–84

See application file for complete search history.

(56) References Cited

U.S. PATENT DOCUMENTS

| | | | |
|---|---|---|---|
| 5,091,963 A | 2/1992 | Litt et al. | 382/149 |
| 5,124,927 A | 6/1992 | Hopewell et al. | 700/121 |
| 5,497,007 A | 3/1996 | Uritsky et al. | 250/491.1 |
| 5,511,005 A | 4/1996 | Abbe et al. | 702/84 |
| 5,642,298 A | 6/1997 | Mallory et al. | 702/117 |
| 5,739,906 A * | 4/1998 | Evans et al. | 356/503 |
| 5,750,908 A | 5/1998 | Drohan | 73/865.9 |
| 5,966,243 A * | 10/1999 | Braunecker et al. | 359/642 |
| 5,978,085 A * | 11/1999 | Smith et al. | 356/521 |
| 5,986,760 A * | 11/1999 | Nakayama et al. | 356/511 |
| 6,086,204 A * | 7/2000 | Magnante | 351/212 |
| 6,094,268 A | 7/2000 | Oshida et al. | 356/623 |
| 6,199,986 B1 * | 3/2001 | Williams et al. | 351/221 |
| 6,341,183 B1 * | 1/2002 | Goldberg | 382/276 |
| 6,547,395 B1 * | 4/2003 | Neal et al. | 351/246 |

* cited by examiner

*Primary Examiner*—Bhavesh M. Mehta
*Assistant Examiner*—Manav Seth
(74) *Attorney, Agent, or Firm*—Weingarten, Schurgin, Gagnebin & Lebovici LLP

(57) ABSTRACT

This method removes high frequency noise from shape data, significantly improves metrology system (10) performance and provides very compact representation of the shape. This model-based method for wafer shape reconstruction from data measured by a dimensional metrology system (10) is best accomplished using the set of Zernike polynomials (matrix L). The method is based on decomposition of the wafer shape over the complete set of the spatial function. A weighted least squares fit is used to provide the best linear estimates of the decomposition coefficients (Bnk). The method is operable with data that is not taken at regular data points and generates a reduced data field of Zernike coefficients compared to the large size of the original data field.

35 Claims, 3 Drawing Sheets

SPECIMEN TOPOGRAPHY RECONSTRUCTION

CROSS REFERENCE TO RELATED APPLICATIONS

This application claims priority of U.S. Provisional Patent Application No. 60/174,082 Entitled: SPECIMEN TOPOGRAPHY RECONSTRUCTION filed Dec. 30, 1999, incorporated herein by reference.

STATEMENT REGARDING FEDERALLY SPONSORED RESEARCH OR DEVELOPMENT

N/A

BACKGROUND OF THE INVENTION

Wafer shape is a geometric characteristic of a semiconductor wafer, which describes the position of the wafer's central plane surface in space. The bow, warp and other shape related parameters of semiconductor wafers must be within precise tolerances in order for wafers to be usable. The precision of a dimensional metrology (measurement) system must be tight enough to provide the required control over the quality of manufactured wafers.

The high accuracy metrology of test specimens, such as the topographic measurement of bow, warp, flatness, thickness etc. of such objects as semiconductor wafers, magnetic disks and the like, is impeded by the presence of noise in the output data. Depending on the inherent properties of the instrument and the environment, the data may have a noise content that displays larger peak to peak magnitude than the actual dimensions being measured. It is difficult to remove all sources of wafer vibration in a sensor based dimensional metrology system when the wafer moves between the sensors. The natural frequency of wafer vibration is of the order of tens to a few hundred Hertz, depending on wafer size and loading conditions, and the observed pattern of vibration has a spatial wavelength less than a few mm. If this noise is not removed, it directly affects the repeatability and reproducibility of the measurements of the system.

The measurements for wafer shape are typically taken at a plurality of points over the specimen surface. The positions of those points are not rigorously controlled between specimens. Therefore, the same data point may not be from the same exact location on each specimen tested by a particular metrology unit. This limits the usefulness of such noise elimination techniques as correlation analysis. Similarly the desire to process data for noise reduction from arbitrary shapes, particularly circular, reduces the attractiveness of high speed data systems such as Fast Fourier Transforms. Wafer shape is mostly a low spatial frequency characteristic. This makes it possible to remove vibration noise by using a low pass 2D spatial filter.

Convolution-based filters require a regular, evenly spaced data set that uses a priori information about the analytical continuation of the wafer shape beyond the wafer boundaries, e.g. the periodic behavior of the wafer shape. Because of this requirement for regular data and a priori information, conventional filters such as convolution techniques are not applicable for wafer shape vibration-noise removal. Fast Fourier transforms are an alternate high speed data processing method, but they are not well adapted to noise reduction processing from arbitrary non-rectilinear shapes, particularly circular shapes.

An analytical method for removing the noise content from metrology measurements of wafer specimens that accommodates the variability of data points is needed.

BRIEF SUMMARY OF THE INVENTION

This invention has application for wafer shape metrology systems where the wafer moves between two-dimensional sensors that scan it and the scan pattern is not necessarily evenly spaced in Cartesian co-ordinates.

The invention provides a method to reduce the noise in metrological data from a specimen's topography. The model-based method allows wafer shape reconstruction from data measured by a dimensional metrology system by quantifying the noise in the measurements. The method is based on decomposition of the wafer shape over the full set of spatial measurements. A weighted least squares fit provides the best linear estimate of the decomposition coefficients for a particular piece of test equipment. The fact that wafer's noise is predominantly a low frequency spatial object guarantees fast convergence. An important advantage of the use of the least squares fit method is the fact that a regular grid of data points is not required to calculate the coefficients. Zernike polynomials are preferred for wafer shape reconstruction, as they operate with data that is not taken at regular data points and that represents circular objects.

At least one set of raw data from a measurement is analyzed to obtain a characterizing matrix of the Zernike type for that particular instrument. A least squares fit on the single value decomposition of the data is used to initially calculate the matrix characterizing the instrument. Thereafter, this matrix does not need to be recalculated unless factors change the errors in the measurement instrumentation.

Data characterizing the topography of a specimen, in the form of Zernike coefficients, can be sent with specimens or telecommunicated anywhere. Because the Zernike coefficients are a complete characterization and are efficient in using minimum data space, this method significantly improves metrology system performance by removing high frequency noise from the shape data and providing a very compact representation of the shape.

BRIEF DESCRIPTION OF THE SEVERAL VIEWS OF THE DRAWING

These and other objects, aspects and advantages of the present invention will become clear as the invention becomes better understood by referring to the following solely exemplary and non-limiting detailed description of the method thereof and to the drawings, wherein.

DETAILED DESCRIPTION OF THE INVENTION

Figure 1:
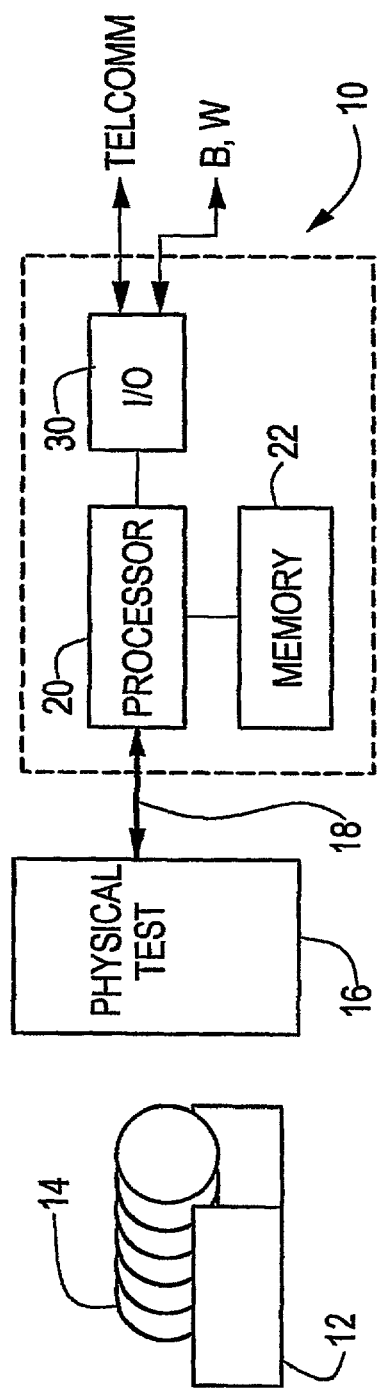
FIG. 1 shows apparatus for measuring the topography of a specimen, in particular of a semiconductor wafer.

According to the present invention, and as shown in FIG. 1, a metrology system 10 receives a cassette 12 of semiconductor wafers 14 for testing of surface properties, such as those noted above. The wafers 14 are measured in a physical test apparatus 16, such as any of the ADE Corporation's well-known measurement stations, the WAFERCHECK™ systems being one such.

The physical test apparatus 16 outputs data to a processor 20 on a communications line 18. The data is typically a vector of measured wafer artifacts, such as flatness height, developed during a spiral scan of the wafer. The present invention operates to eliminate or reduce the noise from the wafer measurement system.

The raw noisy data is typically stored in a memory area 22 where its vector can be represented as $W(\rho, \phi)$, where $\rho$ is the normalized (r/radius) radial location of each measurement point, and $\theta$ is the angle in polar coordinates of the measurement point. The processor 20 performs a transform on this data using a previously calculated matrix, L, which represents the noise characteristic of the measurement station 10. This transform outputs the coefficients of a function that gives the noise reduced topography of the specimen at each desired point. The specimen shape is normalized for noise data alone. The outputs are fed to an input/output interface 30 that may transmit the output to a remote location. The coefficients may also be transmitted from the I/O unit 30 to remote locations, or sent along with the specimen on a data carrier, the Internet or any other form as desired.

The previously calculated matrix, L, is advantageously represented as a Zernike polynomial. Zernike polynomials were introduced [F.Zernike, Physica, 1(1934), 689] and used to describe aberration and diffraction in the theoretical and applied optics. These 2D polynomials represent a complete orthogonal set of functions over the unit circle. Any differentiable function defined over the finite radius circle can be represented as a linear combination of Zernike polynomials. There is no need for a priori information as is the case for convolution techniques. Zernike polynomials are invariant relative to rotation of the coordinate system around an axis normal to the wafer plane. This invariance aids in shape data analysis, especially for data having orientation dependencies. The spectrum of Zernike decomposition coefficients has analogues to power spectral density in Fourier space. The invariance character is that it loses spatial significance as a Fourier series loses time relationships.

The transform from shape $W(r,\theta)$ onto Zernike functional space (n, k) is expressed as:

$$W(r, \theta) = \sum_{n,k} B_{nk} R_n^k(\rho) \exp(-ik\theta), \tag{1}$$

where, $(r,\theta)$ are data point polar coordinates,
$\rho = r$/wafer radius,
$B_{nk}$ is the decomposition coefficient, and $$R_n^k = \sum_{s=0}^{(n-k)/2} (-1)^s (n-s)! / (s!((n+k)/2 - s)!((n-k)/2 - s)!) \rho^{(n-2s)} \tag{2}$$

Where n and k and s are arbitrary variables of synthetic space.

The decomposition coefficients $B_{nk}$ are calculated from the system of linear equations (1). This system is over determined, in that the number of equations (One for each data point) is two orders of magnitude greater that the number of coefficients $B_{nk}$ (unknowns).

The $B_{nk}$ decomposition coefficients can be kept to a small number, typically around 100 by selection of the limits on n, and on k, which varies from $-n$ to $+n$ integrally. The data range typically is large enough to accurately sample the noise being cancelled, while small enough to be manageable. The spacial filtering is a result of the limit on the range for s, which is allowed to grow in the range 0 ... n. For wafer metrology, an n of about 10 filters out the noise component described above for the ADE Corporation equipment.

The system of equations (1) is solved using the weighted least squares fit, because weighted least squares, fit overcomes measurement errors in the input data. Weightings are determined based on the reliability of data; when data is more reliable (exhibits smaller variances), it is weighted more heavily. The calculated covariance matrix is used to assign weight to data points. Using the statistical weightings, improves the fit of the output.

According to Strang, [Strang, G., Introduction to Applied Mathematics, Wellesley-Cambridge, 1986, p. 398.] the best unbiased (without preconditions) solution of the system (1) can be written as $$B = (A^T \Sigma^{-1} A)^{-1} A^T \Sigma^{-1} W, \tag{3}$$

where,
B—vector of decomposition coefficients,
A—matrix of $\{\{R_n^k(\rho_j)\exp(-ik\theta_j)\}, j=1,2,\ldots,$ number of measured points.
T—stands for transpose matrix.
$\Sigma^{-1}$—inverse of the covariance matrix $\Sigma$.
W—vector of measured values $W(\rho_j, \theta_j)$.

The matrix $L = (A^T \Sigma^{-1} A)^{-1} A^T \Sigma^{-1})$ in front of W in solution (3) does not depend on actual measured values. Therefore, for a given scan pattern it can be pre-calculated and stored in a computer memory. Matrix value L will need to be recalculated each time the error function of the instrument changes. The matrix value L is calculated using the Single Value Decomposition (SVD) method [Forsythe, G. E., Moler, C. B., Computer Solution of Linear Algebraic Systems, Prentice-Hall, 1971]. SVD does not require evenly sampled data points.

Once L is determined, only one matrix multiplication is required to calculated the unknowns in B. This procedure, when implemented, is as fast as a Fast Fourier Transform but avoids the 2D Fast Fourier Transform's difficulties dealing with the wafers' circular boundaries and any non-Cartesian scan pattern.

The processor 20 of FIG. 1 can output either the Zernike coefficients of the actual wafer, or the output can be in the form of $W(r,\theta)$ that gives the noise reduced topography of the specimen or wafer at any desired point. $W(r,\theta)$ can be calculated from the Zernike coefficients.

The suggested method was first implemented and verified in a simulated environment. ANSYS finite element analysis software was used to generate wafer vibration modes and natural frequencies for a number of wafer diameters and loading conditions. Then having the wafer shape measurement process affected by vibration was modeled and simulated in a Matlab. Generated shape data were processed according to the suggested method yielding simulated shape and calibration information.

Figure 2:
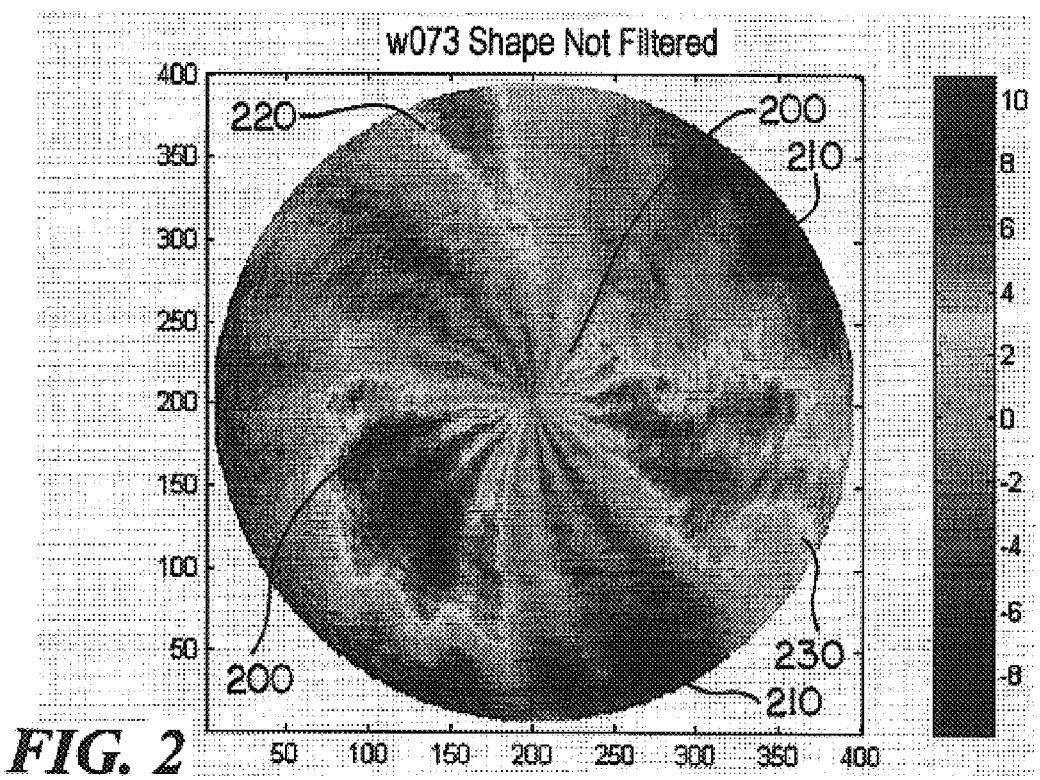
FIG. 2 shows a visual scale image of specimen topography with noise.

Later, shape reconstruction was applied to real world wafer shape data across an ADE platform to confirm the utility of the method. FIGS. 2–5 illustrate the benefit of the present invention in removing noise from the scan of a specimen, shown in topographic presentation in FIG. 2. In FIG. 2, both the noise inherent in the measurement instrument and the irregularities of the wafer are integrated. The wafer appears to have ridges of high points 200 that radiate from the center of the wafer, some areas of nominal height 210, and diffuse regions of high spots 230. It would be difficult to plan a smoothing operation on the wafer shown.

Figure 3:
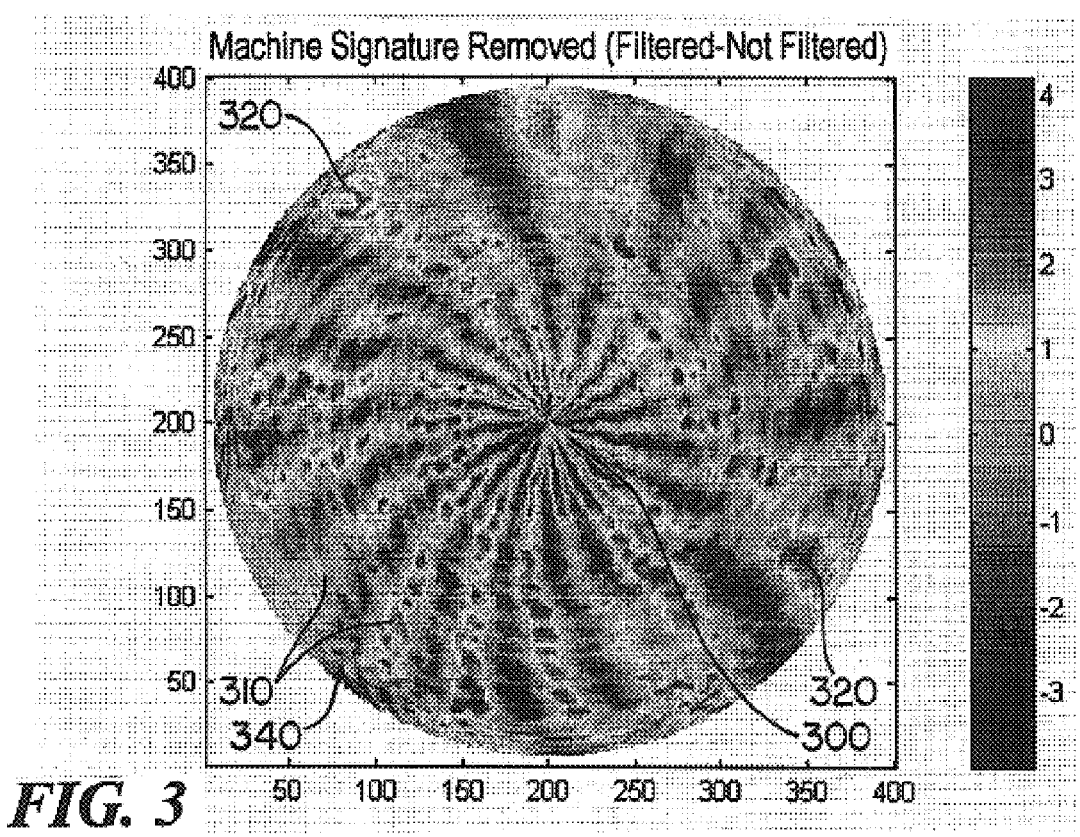
FIG. 3 shows a visual scale image of specimen topography characteristic of the measurement apparatus.
Figure 4:
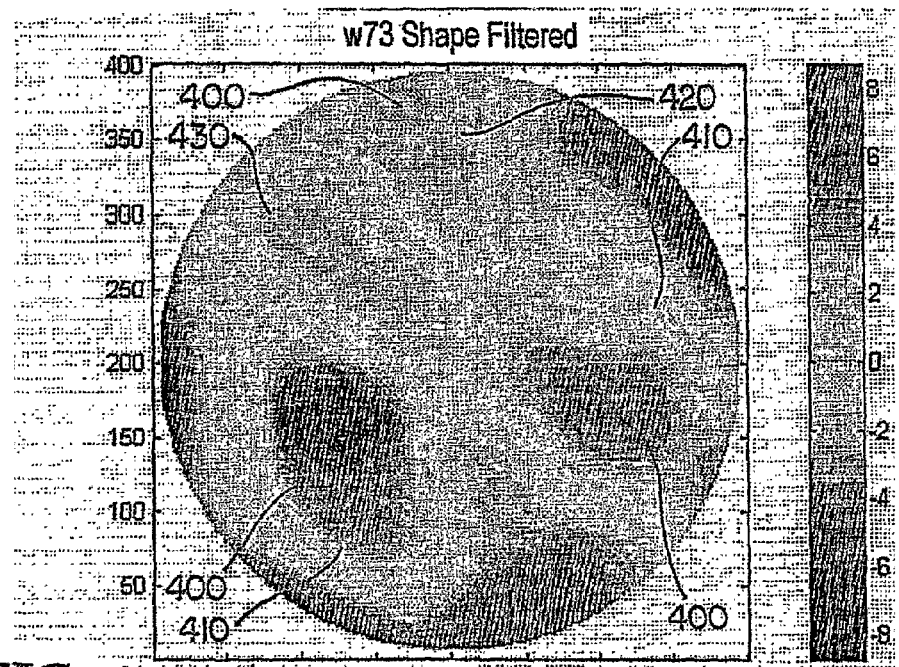
FIG. 4 shows a visual scale image of specimen topography with noise reduction.

In FIG. 3, the noise of the measurement instrument is presented. Here, it is evident that, from a nominal height center 300, arced radial bands 310 extend to the circumference of the specimen 340. Some arcs 310 are compact, while others 320 have a more diffuse aspect. This topographic chart illustrates how the instrument vibrates the specimen in the process of rotating it for scanning. Comparing the scales for FIGS. 2 and 3, shows that the magnitude of the vibration noise is less than the overall irregularity in the specimen. FIG. 4 shows the same specimen's topography with noise of FIG. 3 removed. Now it can be seen that the specimen has 3 high spots 400. Two of the high spots 400 exhibit a sharp gradient 410 between the nominal height of the specimen 430 and the high spot 400. The third high spot 400 exhibits a more gradual gradient 420 between the nominal height 430 and the high spot. Further processing of this topography can be planned.

Figure 5:
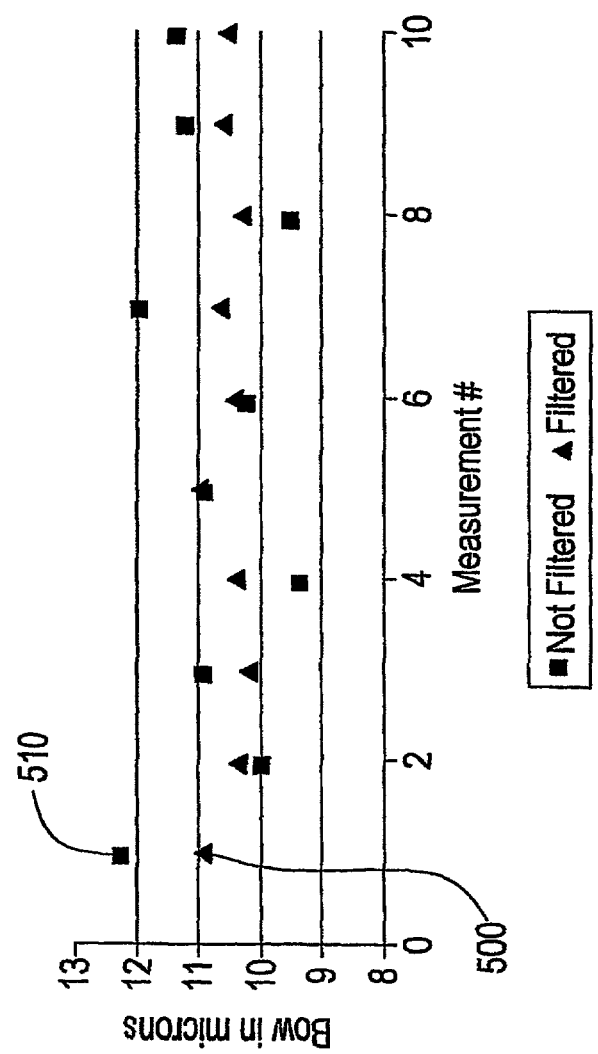
FIG. 5 shows a graph of tighter consistency of measurement after use of the invention.

FIG. 5 illustrates the repeatability of the noise reduced data. For the ten different measurement points, solid triangles 500, representing filtered data, show a bow of between approximately 10 and 11 microns. The solid squares 510, representing noisy data, show a bow of between approximately 12 and 9.5 microns.

The present invention operates to eliminate or reduce noise from noisy data measurements. While the description has exemplified its application to a wafer measurement system, it has application to other flat structures such as memory disks.

Having described preferred embodiments of the invention it will now become apparent to those of ordinary skill in the art that other embodiments incorporating these concepts may be used. Accordingly, it is submitted that the invention should not be limited by the described embodiments but rather should only be limited by the spirit and scope of the appended claims.

We claim:

1. A process for noise reduction from noisy data representing an artifact at sample points in two dimensional space of a wafer specimen, comprising the steps of:
   receiving said noisy data as a vector, each element of which corresponds to one sample point; and
   calculating coefficients of a polynomial which converts said noisy data vector to a two dimensional function continuously representing the artifact in the two dimensional space,
   wherein said noisy data is obtained using a wafer measurement apparatus, said noise being induced in said noisy data by movement of said wafer specimen within said wafer measurement apparatus, and
   wherein said calculating step includes mathematically multiplying said data vector by a matrix representing a noise characteristic of said wafer measurement apparatus to achieve said noise reduction from said noisy data.

2. The process of claim 1 wherein said sample points lack regular geometrically prescribed locations on said wafer specimen.

3. The process of claim 1 wherein said wafer specimen is a non-rectilinear specimen.

4. The process of claim 1 wherein the sample points have a sufficiency to represent the spatial frequency of the noise to be reduced.

5. The process of claim 1 wherein said polynomial is a Zernike polynomial.

6. The process of claim 1 wherein said calculated coefficients are fewer in number than the number of sample points.

7. The process of claim 1 wherein said calculating step includes mathematically multiplying said data vector by the matrix representing the noise characteristic of said measuring apparatus, and wherein said matrix represents a least squares fit between said data vector and the polynomial.

8. The process of claim 7 wherein said matrix is a single value decomposition of said two dimensional space as applied to said apparatus.

9. The process of claim 1 further comprising the step of calculating specimen spatial artifacts from said polynomial for one or more points in said two dimensional space.

10. The process of claim 9 further comprising the step of transmitting said coefficients to a remote location prior to the calculation of spatial artifacts from said polynomial.

11. A process for generating a noise correcting matrix for a wafer measurement apparatus, comprising the steps of:
    receiving data representative of artifacts in two dimensional space of a wafer specimen obtained by said wafer measurement apparatus, each data point associated with a data position,
    wherein movement of said wafer specimen within said wafer measurement apparatus induces noise in said data; and
    calculating a specimen-independent noise compensating matrix as a function of said data position in two dimensional space on said wafer specimen,
    wherein said matrix represents a noise characteristic of said wafer measurement apparatus, and
    wherein noise reduction in said data is achieved by mathematically multiplying said data by said matrix.

12. The process of claim 11 wherein said calculating step applies least squares fit analysis.

13. The process of claim 11 wherein said matrix is of the form of a multiplier of Zernike polynomial decomposition coefficients.

14. An apparatus for noise reduction from noisy data representing an artifact at sample points in two dimensional space of a wafer specimen, comprising:
    means for receiving said noisy data as a vector, each element of which corresponds to one sample point, and
    means for calculating coefficients of a polynomial which converts said noisy data vector to a two dimensional function continuously representing the artifact in the two dimensional space,
    wherein said noisy data is obtained using a wafer measurement apparatus, said noise being induced in said noisy data by movement of said water specimen within said wafer measurement apparatus, and
    wherein said calculating means includes means for mathematically multiplying said data vector by a matrix representing a noise characteristic of said wafer measurement apparatus to achieve said noise reduction from said noisy data.

15. The apparatus of claim 14 wherein said wafer specimen is a non-rectilinear specimen.

16. The apparatus of claim 14 wherein the sample points have a sufficiency to represent the spatial frequency of the noise to be reduced.

17. The apparatus of claim 14 wherein said polynomial is a Zernike polynomial.

18. The apparatus of claim 14 wherein said calculated coefficients are fewer in number than the number of data points.

19. The apparatus of claim 14 wherein said matrix represents a least squares fit between the data vector and the polynomial.

20. The apparatus of claim 19 wherein said matrix is a single value decomposition of said two dimensional space as applied to said measuring apparatus.

21. The apparatus of claim 14 further comprising means for calculating specimen spatial artifacts from said polynomial for one or more points in said two dimensional space.

22. The apparatus of claim 21 further comprising means for transmitting said coefficients to a remote location prior to the calculation of spatial artifacts from said polynomial.

23. Apparatus for generating a noise correcting matrix for a wafer measurement apparatus, comprising:
   means for receiving data representative of artifacts in two dimensional space of a wafer specimen obtained by said wafer measurement apparatus, each data point associated with a data position,
   wherein movement of said wafer specimen within said wafer measurement apparatus induces noise in said data; and
   means for calculating a specimen-independent noise compensating matrix as a function of data position in two dimensional space on said wafer specimen,
   wherein said matrix represents a noise characteristic of said wafer measurement apparatus, and
   wherein said calculating means includes means for mathematically multiplying said data by said matrix to achieve noise reduction in said data.

24. The apparatus of claim 23 wherein said calculating means applies least squares if it analysis.

25. The apparatus of claim 23 wherein said matrix is of the form of a multiplier of a Zernike polynomial without decomposition coefficients.

26. The apparatus of claim 14 wherein said means for calculating coefficients is a computer.

27. A model-based method of wafer shape reconstruction comprising:
   obtaining a set of noisy data points representing the wafer shape by a wafer measurement apparatus,
   wherein movement of said wafer within said wafer measurement apparatus induces noise in said noisy data;
   using a complete set of Zernike polynomials as a shape functional space;
   applying a weighted least squares fit between said noisy data points and a set of data points calculated from said Zernike polynomials,
   wherein said weighted least squares fit is represented by a matrix, and said matrix represents a noise characteristic of said wafer measurement apparatus; and
   finding decomposition coefficients for said wafer shape,
   wherein noise reduction is achieved in said noisy data by mathematically multiplying said set of noisy data points by said matrix.

28. The model-based method of claim 27 wherein said decomposition coefficients are a compact wafer shape data representation.

29. The model-based method of claim 27 wherein said set of noisy data points form a scanning pattern that is not necessarily evenly spaced.

30. The apparats of claim 14, wherein said sample points lack regular geometrically prescribed locations on said wafer specimen.

31. The process of claim 1 wherein the movement of said wafer specimen within said wafer measurement apparatus comprises a circular rotation of said wafer specimen.

32. The process of claim 11 wherein the movement of said wafer specimen within said wafer measurement apparatus comprises a circular rotation of said wafer specimen.

33. The apparatus of claim 14 wherein the movement of said wafer specimen within said wafer measurement apparatus comprises a circular rotation of said wafer specimen.

34. The apparatus of claim 23 wherein the movement of said wafer specimen within said wafer measurement apparatus comprises a circular rotation of said wafer specimen.

35. The method of claim 27 wherein the movement of said wafer within said wafer measurement apparatus comprises a circular rotation of said wafer.

* * * * *

UNITED STATES PATENT AND TRADEMARK OFFICE
CERTIFICATE OF CORRECTION

| | | |
|---|---|---|
| PATENT NO. | : 7,136,519 B2 | Page 1 of 1 |
| APPLICATION NO. | : 09/914456 | |
| DATED | : November 14, 2006 | |
| INVENTOR(S) | : Jaydeep Sinha et al. | |

It is certified that error appears in the above-identified patent and that said Letters Patent is hereby corrected as shown below:

Column 7, claim 24, line 41, "if it" should read --fit--.

Signed and Sealed this

Thirty-first Day of July, 2007

JON W. DUDAS
*Director of the United States Patent and Trademark Office*